United States Patent
Nikitin et al.

(10) Patent No.: US 9,385,107 B2
(45) Date of Patent: Jul. 5, 2016

(54) MULTICHIP DEVICE INCLUDING A SUBSTRATE

(71) Applicant: Infineon Technologies AG, Neubiberg (DE)

(72) Inventors: Ivan Nikitin, Regensburg (DE); Joachim Mahler, Regensburg (DE); Khalil Hosseini, Weihmichl (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/959,712

(22) Filed: Aug. 5, 2013

(65) Prior Publication Data

US 2015/0035170 A1 Feb. 5, 2015

(51) Int. Cl.
*H01L 23/48* (2006.01)
*H01L 25/07* (2006.01)
(Continued)

(52) U.S. Cl.
CPC ............ *H01L 25/074* (2013.01); *H01L 23/367* (2013.01); *H01L 23/3735* (2013.01); *H01L 23/49524* (2013.01); *H01L 23/49562* (2013.01); *H01L 23/49827* (2013.01); *H01L 25/0652* (2013.01); *H01L 25/0655* (2013.01); *H01L 25/071* (2013.01); *H01L 25/072* (2013.01); *H01L 23/3121* (2013.01); *H01L 24/40* (2013.01); *H01L 24/48* (2013.01); *H01L 24/73* (2013.01); *H01L 25/18* (2013.01); *H01L 2224/04026* (2013.01); *H01L 2224/04034* (2013.01); *H01L 2224/04042* (2013.01); *H01L 2224/06181* (2013.01); *H01L 2224/08168* (2013.01); *H01L 2224/32225* (2013.01); *H01L 2224/3716* (2013.01); *H01L 2224/37124* (2013.01); *H01L 2224/37147* (2013.01); *H01L 2224/37155* (2013.01); *H01L 2224/40101* (2013.01); *H01L 2224/40137* (2013.01); *H01L 2224/456* (2013.01); *H01L 2224/45124* (2013.01); *H01L 2224/45144* (2013.01); *H01L 2224/45147* (2013.01); *H01L 2224/48091* (2013.01); *H01L 2224/48137* (2013.01); *H01L 2224/48227* (2013.01); *H01L 2224/73221* (2013.01); *H01L 2224/73263* (2013.01); *H01L 2224/73265* (2013.01); *H01L 2224/8382* (2013.01); *H01L 2224/8384* (2013.01); *H01L 2924/1033* (2013.01); *H01L 2924/10253* (2013.01); *H01L 2924/10271* (2013.01); *H01L 2924/10272* (2013.01); *H01L 2924/10329* (2013.01);

(Continued)

(58) Field of Classification Search
CPC ..................................................... H01L 25/074
See application file for complete search history.

(56) References Cited

U.S. PATENT DOCUMENTS

| | | |
|---|---|---|
| 2009/0231810 A1 | 9/2009 | Liang et al. |
| 2011/0108971 A1* | 5/2011 | Ewe et al. ...................... 257/686 |
| 2013/0015495 A1* | 1/2013 | Hauenstein ................... 257/140 |

*Primary Examiner* — Daniel Whalen
(74) *Attorney, Agent, or Firm* — Dicke, Billig & Czaja, PLLC

(57) ABSTRACT

A device includes a substrate including an electrically insulating core, a first electrically conductive material arranged over a first main surface of the substrate, and a second electrically conductive material arranged over a second main surface of the substrate opposite to the first main surface. The device further includes an electrically conductive connection extending from the first main surface to the second main surface and electrically coupling the first electrically conductive material and the second electrically conductive material, a first semiconductor chip arranged over the first main surface and electrically coupled to the first electrically conductive material, and a second semiconductor chip arranged over the second main surface and electrically coupled to the second electrically conductive material.

20 Claims, 6 Drawing Sheets

(51) Int. Cl.
  *H01L 23/367*   (2006.01)
  *H01L 23/373*   (2006.01)
  *H01L 23/495*   (2006.01)
  *H01L 23/498*   (2006.01)
  *H01L 25/065*   (2006.01)
  H01L 23/31      (2006.01)
  H01L 25/18      (2006.01)
  H01L 23/00      (2006.01)

(52) U.S. Cl.
  CPC ............... *H01L2924/1203* (2013.01); *H01L 2924/12042* (2013.01); *H01L 2924/1305* (2013.01); *H01L 2924/13055* (2013.01); *H01L 2924/13062* (2013.01); *H01L 2924/13091* (2013.01); *H01L 2924/14* (2013.01); *H01L 2924/141* (2013.01); *H01L 2924/1431* (2013.01); *H01L 2924/1434* (2013.01); *H01L 2924/1461* (2013.01); *H01L 2924/181* (2013.01); *H01L 2924/1815* (2013.01)

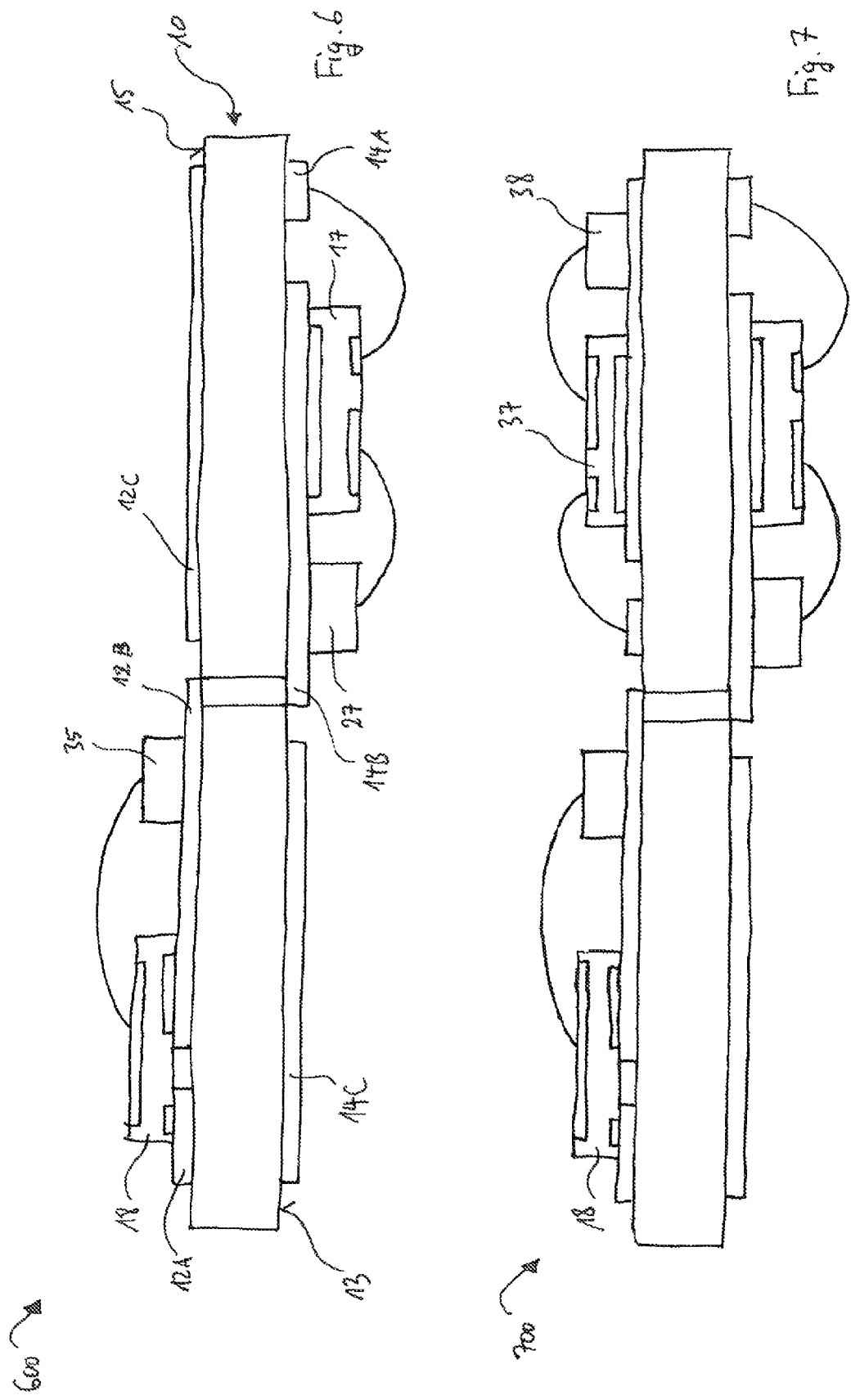

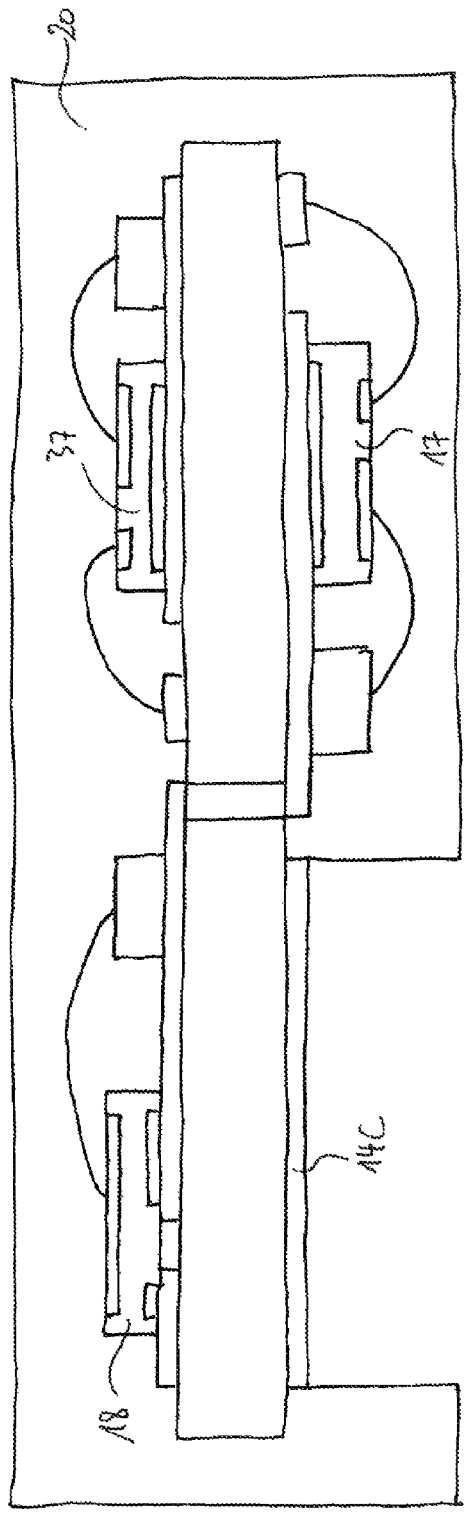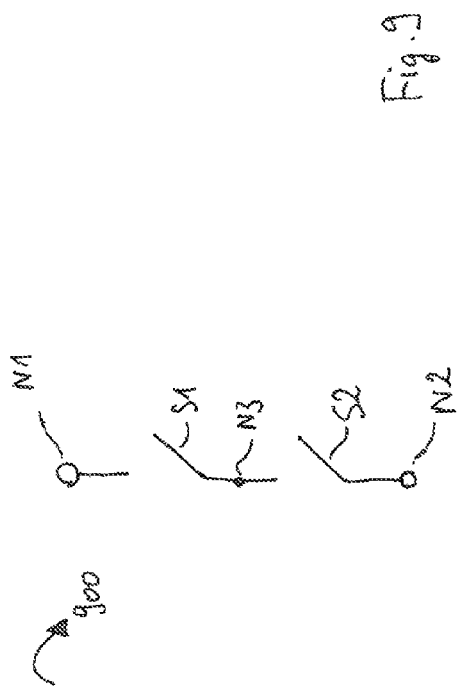

MULTICHIP DEVICE INCLUDING A SUBSTRATE

TECHNICAL FIELD

The disclosure relates to multichip devices including a substrate and methods for manufacturing such multichip devices.

BACKGROUND

Electronic devices may include multiple semiconductor chips and a substrate onto which the semiconductor chips may be mounted. Multichip devices and methods for manufacturing multichip devices constantly have to be improved. It may be desirable to improve a performance and a quality of the multichip devices. In particular, it may be desirable to increase an integration density and to improve a thermal management of the multichip devices.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

FIG. 6 schematically illustrates a cross-sectional view of a further device in accordance with the disclosure.

FIG. 7 schematically illustrates a cross-sectional view of a further device in accordance with the disclosure.

FIG. 8 schematically illustrates a cross-sectional view of a further device in accordance with the disclosure.

FIG. 9 illustrates a schematic diagram of a half bridge circuit.

DETAILED DESCRIPTION

Figure 1:
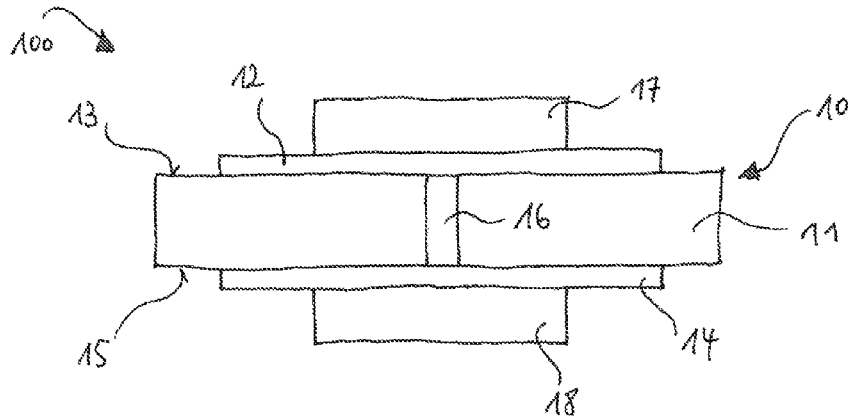
FIG. 1 schematically illustrates a cross-sectional view of a device in accordance with the disclosure.

In the following detailed description, reference is made to the accompanying drawings which illustrate specific aspects in which the disclosure may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the scope of the present disclosure. The following detailed description is thus not to be taken in a limiting sense, and the scope of the present disclosure is defined by the appended claims.

As employed in this specification, the terms "coupled" and/or "electrically coupled" are not meant to mean that the elements must be directly coupled together. Intervening elements may be provided between the "coupled" or "electrically coupled" elements.

Devices and methods for manufacturing the devices are described herein. Description associated with a described device may also hold true for a corresponding method and vice versa. For example, when a specific component of a device is described, a corresponding method for manufacturing the device may include an act of providing the component in a suitable manner, even when such act is not explicitly described or illustrated in the figures. A sequential order of acts of a described method may be exchanged if technically possible. At least two acts of a method may be performed at least partly at the same time. In general, the features of the various exemplary aspects described herein may be combined with each other, unless specifically noted otherwise.

Devices in accordance with the disclosure may include one or more semiconductor chips. The semiconductor chips may be of different types and may be manufactured by different technologies. For example, the semiconductor chips may include integrated electrical, electro-optical or electro-mechanical circuits or passives. The integrated circuits may be designed as logic integrated circuits, analog integrated circuits, mixed signal integrated circuits, power integrated circuits, memory circuits, integrated passives, micro-electro mechanical systems, etc. The semiconductor chips may be manufactured from any appropriate semiconductor material, for example at least one of Si, SiC, SiGe, GaAs, GaN, etc. Furthermore, the semiconductor chips may contain inorganic and/or organic materials that are not semiconductors, for example at least one of insulators, plastics, metals, etc. The semiconductor chips may be packaged or unpackaged.

In particular, one or more of the semiconductor chips may include a power semiconductor. Power semiconductor chips may have a vertical structure, i.e. the semiconductor chips may be fabricated such that electric currents may flow in a direction perpendicular to the main faces of the semiconductor chips. A semiconductor chip having a vertical structure may have electrodes on its two main faces, i.e. on its top side and bottom side. In particular, power semiconductor chips may have a vertical structure and may have load electrodes on both main faces. For example, the vertical power semiconductor chips may be configured as power MOSFETs (Metal Oxide Semiconductor Field Effect Transistors), IGBTs (Insulated Gate Bipolar Transistors), JFETs (Junction Gate Field Effect Transistors), super junction devices, power bipolar transistors, etc. The source electrode and gate electrode of a power MOSFET may be situated on one face, while the drain electrode of the power MOSFET may be arranged on the other face. In addition, the devices described herein may include integrated circuits to control the integrated circuits of the power semiconductor chips.

The semiconductor chips may include contact pads (or contact terminals) which may allow electrical contact to be made with integrated circuits included in the semiconductor chips. For the case of a power semiconductor chip, a contact pad may correspond to a gate electrode, a source electrode or a drain electrode. The contact pads may include one or more metal and/or metal alloy layers that may be applied to the semiconductor material. The metal layers may be manufactured with any desired geometric shape and any desired material composition.

Devices in accordance with the disclosure may include a substrate. The substrate may be configured to provide electrical interconnections between electronic components and/or semiconductor chips arranged over the substrate such that an electronic circuit may be formed. In this regard, the substrate may act similar to a Printed Circuit Board (PCB). The materials of the substrate may be chosen to support a cooling of electronic components arranged over the substrate. The substrate may be configured to carry high currents and provide high voltage isolation, for example up to several thousand volts. The substrate may further be configured to operate at temperatures up to 150° C., in particular up to 200° C. or even higher. Since the substrate may particularly be employed in power electronics, it may also be referred to as "power electronic substrate".

The substrate may include an electrically insulating core that may include at least one of a ceramic material and a plastic material. For example, the electrically insulating core may include at least one of aluminum oxide, aluminum nitride, beryllium oxide, etc. The substrate may have one or more main surfaces, wherein each main surface may be formed such that one or more semiconductor chips may be arranged thereupon. In particular, the substrate may include a first main surface and a second main surface arranged opposite to the first main surface. The first main surface and the second main surface may be substantially parallel to each other. The electrically insulating core may have a thickness between about 50 μm (micrometer) and about 1.6 millimeter.

Devices in accordance with the disclosure may include a first electrically conductive material that may be arranged over (or on) a first main surface of the substrate. In addition, the devices may include a second electrically conductive material that may be arranged over (or on) a second main surface of the substrate opposite to the first main surface. The term "substrate" as used herein may refer to the electrically insulating core, but may also refer to the electrically insulating core including the electrically conductive material arranged over the core. The electrically conductive material may include at least one of a metal and a metal alloy, for example copper and/or a copper alloy. The electrically conductive material may be shaped or structured in order to provide electrical interconnections between electronic components arranged over the substrate. In this regard, the electrically conductive material may include electrically conductive lines, layers, surfaces, zones, etc. For example, the electrically conductive material may have a thickness between about 0.1 millimeter and about 0.5 millimeter.

In one example, the substrate may correspond to (or may include) a Direct Copper Bond (DCB) or Direct Bond Copper (DBC) substrate. A DCB substrate may include a ceramic core and a sheet or layer of copper arranged over (or on) one or both main surfaces of the ceramic core. The ceramic material may include at least one of alumina ($Al_2O_3$), that may have a thermal conductivity from about 24 W/mK to about 28 W/mK, aluminum nitride (AlN), that may have a thermal conductivity greater than about 150 W/mK, beryllium oxide (BeO), etc. Compared to pure copper, the substrate may have a coefficient of thermal expansion similar or equal to that of silicon.

For example, the copper may be bonded to the ceramic material using a high-temperature oxidation process. Here, the copper and the ceramic core may be heated to a controlled temperature in an atmosphere of nitrogen containing about 30 ppm of oxygen. Under these conditions, a copper-oxygen eutectic may form which may bond both to copper and oxides that may be used as substrate core. The copper layers arranged over the ceramic core may be pre-formed prior to firing or may be chemically etched using a printed circuit board technology to form an electrical circuit. A related technique may employ a seed layer, photo imaging and additional copper plating in order to allow for electrically conductive lines and through-vias to connect a front main surface and a back main surface of the substrate.

In a further example, the substrate may correspond to (or may include) an Active Metal Brazed (AMB) substrate. In AMB technology, metal layers may be attached to ceramic plates. In particular, a metal foil may be soldered to a ceramic core using a solder paste at high temperatures from about 800° C. to about 1000° C.

In yet a further example, the substrate may correspond to (or may include) an Insulated Metal Substrate (IMS). An IMS may include a metal base plate covered by a thin layer of dielectric and a layer of copper. For example, the metal base plate may be made of or may include at least one of aluminum and copper while the dielectric may be an epoxy-based layer. The copper layer may have a thickness from about 35 μm (micrometer) to about 200 μm (micrometer) or even higher. The dielectric may e.g. be FR-4-based and may have a thickness of about 100 μm (micrometer).

Devices in accordance with the disclosure may include at least one electrically conductive connection that may extend from a first main surface of the substrate to a second main surface of the substrate. In particular, the electrically conductive connection may be configured to electrically connect a first electrically conductive material arranged over the first main surface and a second electrically conductive material arranged over the second main surface. In this way, an electrical connection between a first semiconductor chip in contact with the first electrically conductive material and a second semiconductor chip in contact with the second electrically conductive material may be provided.

An opening in the substrate containing the electrically conductive connection may be manufactured by any suitable technique, for example by employing at least one of drilling, laser drilling, etching, wet etching, plasma etching, etc. The outline or edge of the opening may be of arbitrary shape, for example circular, rectangular, quadratic, polygonal, etc. The opening may have a width from about 50 μm (micrometer) to about 2.6 millimeter. An electrically conductive material may be arranged in the opening to provide the electrically conductive connection. For example, the electrically conductive material may include at least one of a metal and a metal alloy. Any suitable technology may be used for manufacturing the electrically conductive connection, for example a through-hole technology or a via technology.

Devices in accordance with the disclosure may include an encapsulation material that may cover one or more components of the device. For example, the encapsulation material may at least partly encapsulate the substrate. The encapsulation material may be electrically insulating and may form an encapsulation body. The encapsulation material may include a thermoset, a thermoplastic or hybrid material, a mold compound, a laminate (prepreg), a silicone gel, etc. Various techniques may be used to encapsulate the components with the encapsulation material, for example at least one of compression molding, injection molding, powder molding, liquid molding, lamination, etc.

Devices in accordance with the disclosure may include one or more electrically conductive elements. In one example, an electrically conductive element may provide an electrical connection to a semiconductor chip of the device. For example, the electrically conductive element may be connected to an encapsulated semiconductor chip and may protrude out of the encapsulation material. Hence, it may be possible to electrically contact the encapsulated semiconductor chip from outside of the encapsulation material via the electrically conductive element. In a further example, an electrically conductive element may provide an electrical connection between components of the device, for example between two semiconductor chips. A contact between the electrically conductive element and e.g. a contact pad of a semiconductor chip may be established by any appropriate technique. In an example, the electrically conductive element may be soldered to another component, for example by employing a diffusion soldering process.

In one example, the electrically conductive element may include one or more clips (or contact clips). The shape of a clip is not necessarily limited to a specific size or a specific geometric shape. The clip may be fabricated by at least one of stamping, punching, pressing, cutting, sawing, milling, and any other appropriate technique. For example, it may be fabricated from metals and/or metal alloys, in particular at least one of copper, copper alloys, nickel, iron nickel, aluminum, aluminum alloys, steel, stainless steel, etc. In a further example, the electrically conductive element may include one or more wires (or bond wires or bonding wires). The wire may include a metal or a metal alloy, in particular gold, aluminum, copper, or one or more of their alloys. In addition, the wire may or may not include a coating. The wire may have a thickness from about 15 μm (micrometer) to about 1000 μm (micrometer), and more particular a thickness of about 50 μm (micrometer) to about 500 μm (micrometer).

Figure 2:
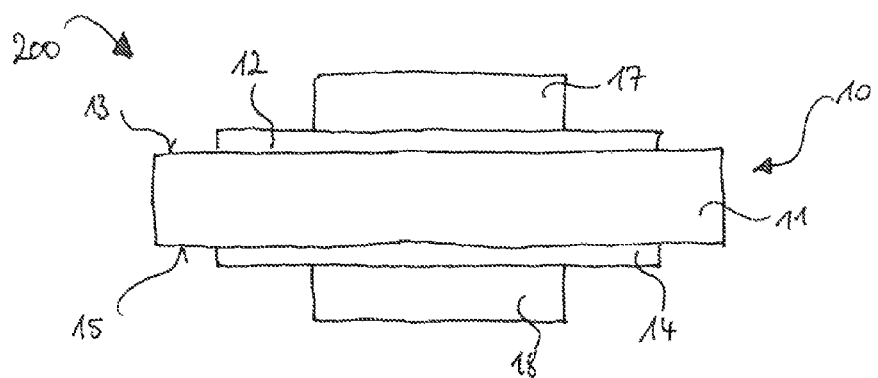
FIG. 2 schematically illustrates a cross-sectional view of a further device in accordance with the disclosure.
Figure 3:
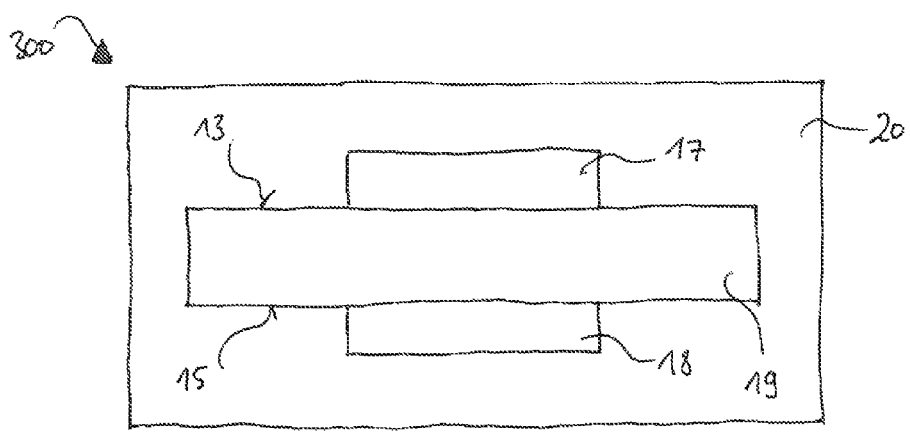
FIG. 3 schematically illustrates a cross-sectional view of a further device in accordance with the disclosure.

FIGS. 1 to 3 illustrate devices 100 to 300 in accordance with the disclosure. More detailed multichip devices similar to the devices 100 to 300 and methods for manufacturing such devices are described below. Features of the described devices and methods may be combined with each other, unless specifically noted otherwise.

FIG. 1 schematically illustrates a cross-sectional view of a device 100 in accordance with the disclosure. The device 100 may include a substrate 10 including an electrically insulating core 11. The device 100 may further include a first electrically conductive material 12 arranged over a first main surface 13 of the substrate 10. The device 100 may further include a second electrically conductive material 14 arranged over a second main surface 15 of the substrate 10 opposite to the first main surface 13. The device 100 may further include an electrically conductive connection 16 extending from the first main surface 13 to the second main surface 15. The electrically conductive connection 16 may electrically couple the first electrically conductive material 12 and the second electrically conductive material 14. The device 100 may further include a first semiconductor chip 17 arranged over the first main surface 13 and electrically coupled to the first electrically conductive material 12. The device 100 may further include a second semiconductor chip 18 arranged over the second main surface 15 and electrically coupled to the second electrically conductive material 14.

FIG. 2 schematically illustrates a cross-sectional view of a device 200 in accordance with the disclosure. The device 200 may include a substrate 10 including an electrically insulating core 11. The device 200 may further include a first electrically conductive material 12 arranged over a first main surface 13 of the substrate 10. The device 200 may further include a second electrically conductive material 14 arranged over a second main surface 15 of the substrate 10. The device 200 may further include a first semiconductor chip 17 arranged over the first main surface 13 and a second semiconductor chip 18 arranged over the second main surface 15.

FIG. 3 schematically illustrates a cross-sectional view of a device 300 in accordance with the disclosure. The device 300 may include a DCB substrate 19. The device 300 may further include a first semiconductor chip 17 arranged over a first main surface 13 of the DCB substrate 19 and a second semiconductor chip 18 arranged over a second main surface 15 of the DCB substrate 19. The device 300 may further include an encapsulation material 20 that may at least partly encapsulate the DCB substrate 19. For the sake of simplicity, the encapsulation material 20 is indicated by a simple rectangular line enclosing the components of the device 300. The device 300 may include one or more electrical contact elements (not illustrated) that may provide a possibility to electrically contact encapsulated components from outside of the encapsulation material 20.

Figure 4A:
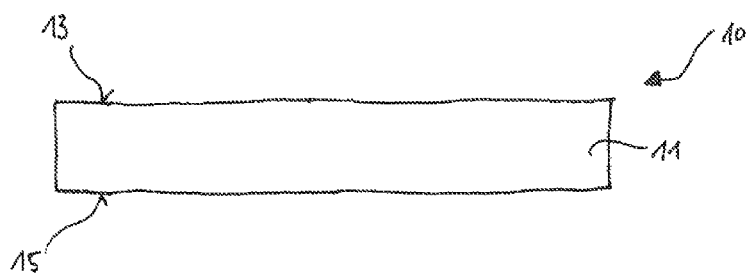
FIGS. 4A to 4D schematically illustrate a cross-sectional view of a method for manufacturing a further device in accordance with the disclosure.
Figure 4B:
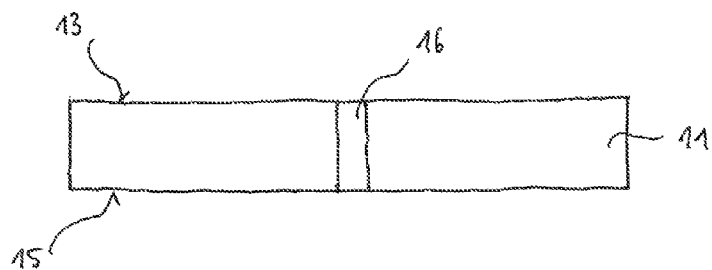
Figure 4C:
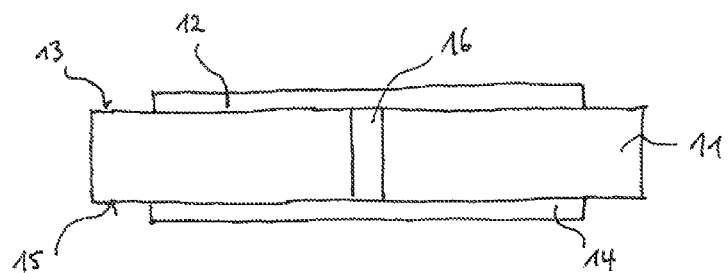
Figure 4D:
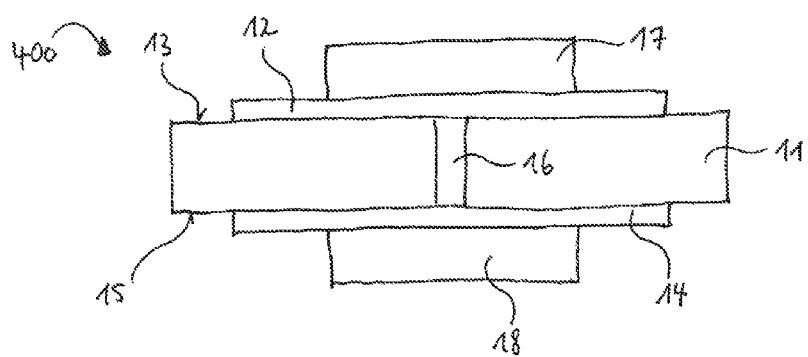

FIGS. 4A to 4D schematically illustrate a method for manufacturing a device in accordance with the disclosure. A cross section of a device 400 obtained by the method is illustrated in FIG. 4D. For example, the device 400 may be similar to the device 100 of FIG. 1. In FIG. 4A, a substrate 10 including an electrically insulating core 11 may be provided. The substrate 10 may have a first main surface 13 and a second main surface 15 opposite the first main surface 13. In FIG. 4B, an electrically conductive connection 16 may be provided, wherein the electrically conductive connection 16 may extend from the first main surface 13 to the second main surface 15. In FIG. 4C, a first electrically conductive material 12 may be arranged over the first main surface 13, and a second electrically conductive material 14 may be arranged over the second main surface 15. The electrically conductive connection 16 may electrically couple the first electrically conductive material 12 and the second electrically conductive material 14. In FIG. 4D, a first semiconductor chip 17 may be arranged over the first main surface 13, wherein the first semiconductor chip 17 may be electrically coupled to the first electrically conductive material 12. In addition, a second semiconductor chip 18 may be arranged over the second main surface 15, wherein the second semiconductor chip 18 may be electrically coupled to the second electrically conductive material 14.

Figure 5A:
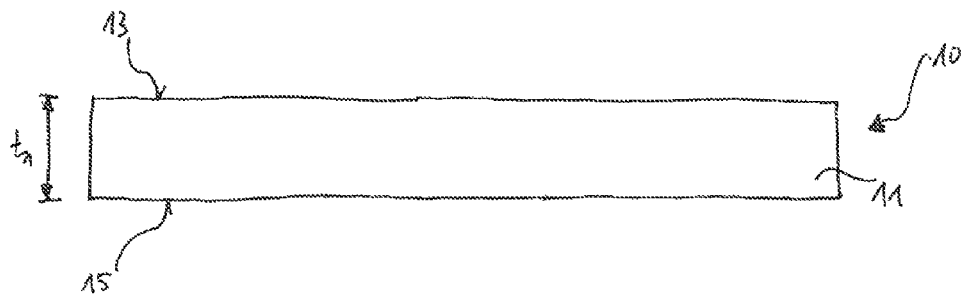
FIGS. 5A to 5G schematically illustrate a cross-sectional view of a method for manufacturing a further device in accordance with the disclosure.
Figure 5B:
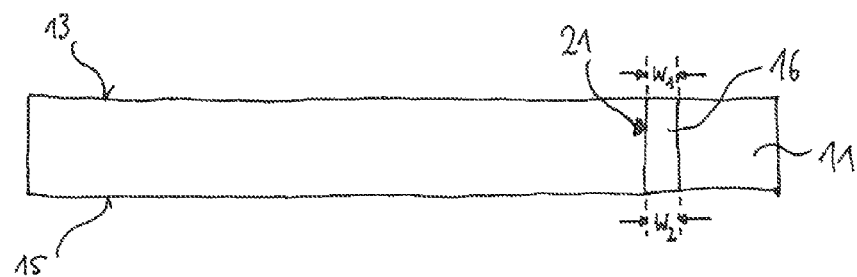
Figure 5C:
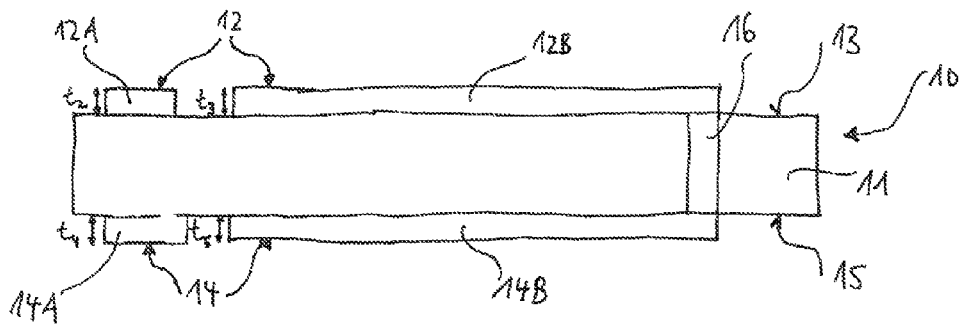
Figure 5D:
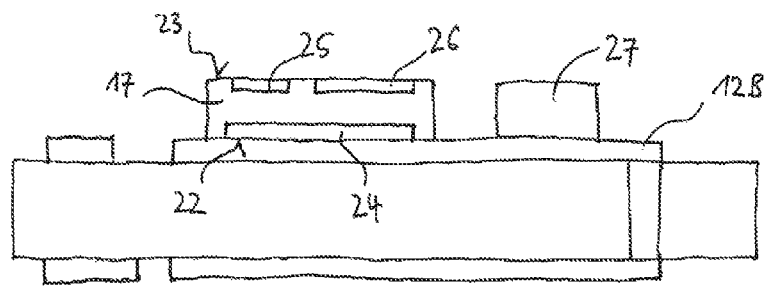
Figure 5E:
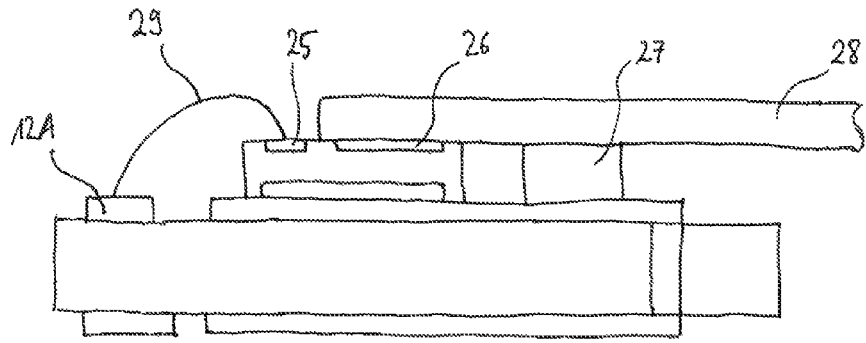
Figure 5F:
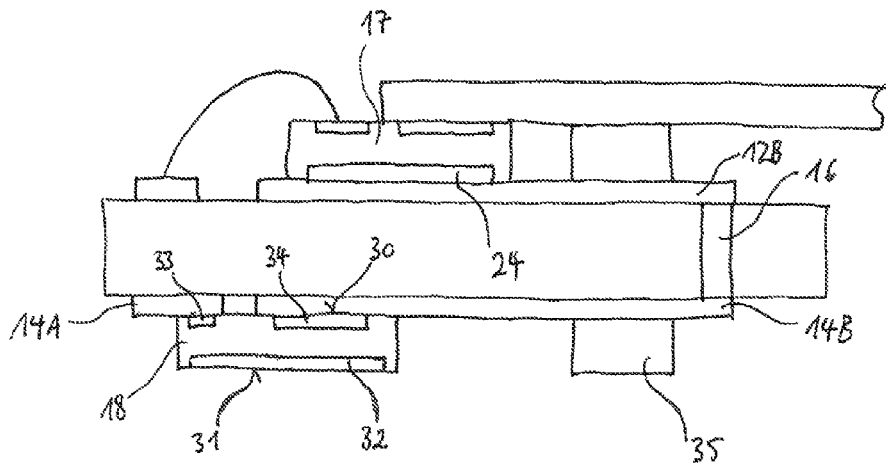
Figure 5G:
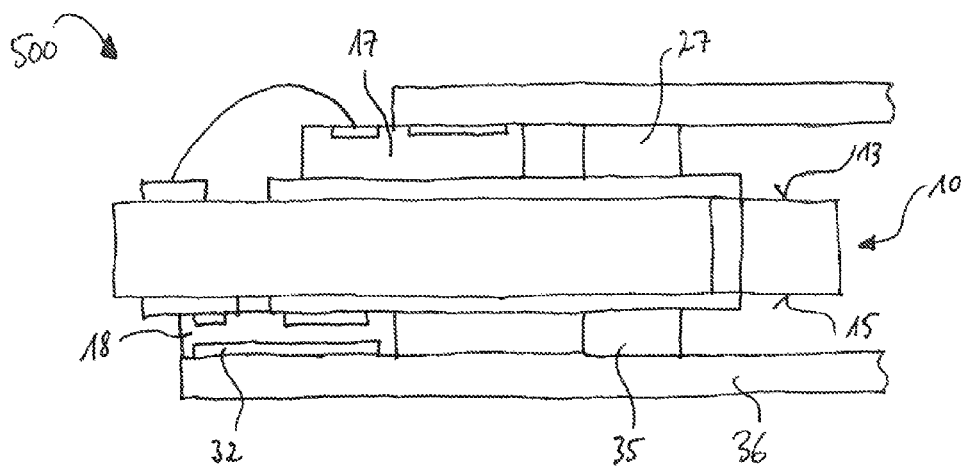

FIGS. 5A to 5G schematically illustrate a method for manufacturing a device in accordance with the disclosure. A cross section of an exemplary manufactured device 500 obtained by the method is shown in FIG. 5G. Details of devices manufactured according to the described method may be likewise applied to any other device in accordance with the disclosure. In addition, the method shown in FIGS. 5A to 5G may be seen as an implementation of the method illustrated in FIGS. 4A to 4D. Details of the manufacturing method that are described below may therefore be likewise applied to the method of FIGS. 4A to 4D.

In FIG. 5A, a substrate 10 including an electrically insulating core 11 may be provided. The electrically insulating core 11 may include at least one of a ceramic material and a plastic material. In particular, the electrically insulating core 11 may include at least one of aluminum oxide, aluminum nitride, beryllium oxide, aluminum titanate, silicon nitride, zirconium oxide, silicon carbide, titanium oxide, etc. The electrically insulating core 11 may include a first main surface 13 and a second main surface 15 arranged opposite to the first main surface 13. The electrically insulating core 11 may have a thickness $t_1$ from about 50 μm (micrometer) to about 1.6 millimeter.

In FIG. 5B, an opening 21 in the electrically insulating core 11 may be provided. The opening 21 may extend throughout the electrically insulating core 11 from the first main surface 13 to the second main surface 15. For example, the opening 21 may be manufactured by using at least one of the following techniques: drilling, laser drilling, etching, wet etching, plasma etching, etc. The outline or edge of the opening 21 on the first main surface 13 and on the second main surface 15 may be of arbitrary shape, for example circular, rectangular, quadratic, polygonal, etc. The opening 21 may have a first width $w_1$ on the first main surface 13 and a second width $w_2$ on the second main surface 15. Each of the first width $w_1$ and the second width $w_2$ may lie in a range from about 50 μm (micrometer) to about 2.6 millimeter. The term "width" may refer to a maximum lateral extent of the opening 21 on the respective main surface. An electrically conductive connection 16 may be placed in the opening 21. For example, the electrically conductive connection 16 may include at least one of a metal and a metal alloy.

In FIG. 5C, a first electrically conductive material 12 may be arranged over (or on) the first main surface 13. For example, the first electrically conductive material 12 may include at least one of a metal and a metal alloy or any other suitable electrically conductive material. In particular, the first electrically conductive material 12 may include at least one of copper and a copper alloy. The first electrically conductive material 12 may be structured and may include a first section 12A and a second section 12B. However, the first electrically conductive material 12 may also include further sections (not illustrated) whose shapes and arrangements may particularly depend on the number and types of the electronic components that may be arranged over the first surface 13 later on. For example, the first section 12A and the second section 12B may be deposited as layers having thicknesses $t_2$ and $t_3$. Each thickness $t_2$ and $t_3$ may lie in a range from about 0.1 millimeter to about 0.5 millimeter. In one example, the thicknesses $t_2$ and $t_3$ may be equal, but they may also differ from each other in another example. The second section 12B may be electrically coupled to the electrically conductive connection 16.

A second electrically conductive material 14 may be arranged over (or on) the second main surface 15. Description associated with the first electrically conductive material 12 may also hold true for the second electrically conductive material 14. The second electrically conductive material 14 may include a first section 14A and a second section 14B. For example, the first section 14A and the second section 14B may be deposited as layers having thicknesses $t_4$ and $t_5$, respectively, wherein each thickness $t_4$ and $t_5$ may lie in a range from about 0.1 millimeter to about 0.5 millimeter. The thicknesses $t_4$ and $t_5$ may be equal in one example, but may also differ from each other in another example. The second section 14B may be electrically connected to the electrically conductive connection 16. Hence, the electrically conductive connection 16 may provide an electrical connection between the second section 12B of the first electrically conductive material 12 and the second section 14B of the second electrically conductive material 14.

The term "substrate" may refer to the electrically insulating core 11, but may also refer to the electrically insulating core 11 including the first electrically conductive material 12 and the second electrically conductive material 14. For example, the substrate 10 of FIG. 5C may correspond to a DCB substrate, wherein the electrically insulating core 11 may be made of or may include at least one of alumina ($Al_2O_3$), aluminum nitride (AlN), beryllium oxide (BeO), etc. Each of the first electrically conductive material 12 and the second electrically conductive material 14 may be made of or may include copper.

In FIG. 5D, a first semiconductor chip 17 may be arranged over (or on) the second section 12B of the first electrically conductive material 12. In the example of FIG. 5D, the first semiconductor chip 17 may correspond to or may include a power semiconductor chip, for example an IGBT chip. The first semiconductor chip 17 may include a first main surface 22 facing the second section 12B and an opposite second main surface 23 facing away from the second section 12B. A first electrical contact 24 may be arranged over (or on) the first main surface 22. In particular, the first electrical contact 24 may include a drain electrode of the first semiconductor chip 17. The drain electrode 24 may cover a main part of the first main surface 22, and more particular the drain electrode 24 may completely cover the first main surface 22. The area of the main surfaces 22 and 23 of the first semiconductor chip 17 may be greater than 100 $mm^2$. For example, the main surfaces 22 and 23 of the first semiconductor chip 17 may be of rectangular or quadratic shape, wherein each side of the rectangle or the square may have a length from about 10 millimeter to about 13 millimeter.

The drain electrode 24 may be electrically coupled to the second section 12B of the first electrically conductive material 12. In one example, the drain electrode 24 may be in direct physical contact with the second section 12B. In a further example, an additional electrically conductive material may be arranged between the drain electrode 24 and the second section 12B. For example, a connection between the drain electrode 24 and the second section 12B of the first electrically conductive material 12 may be provided by using at least one of a sintering process, a diffusion soldering process, a bonding process, etc.

A second electrical contact 25 and a third electrical contact 26 may be arranged over (or on) the second main surface 23 of the first semiconductor chip 17. The second electrical contact 25 may correspond to or may include a gate electrode of the first semiconductor chip 17, and the third electrical contact 26 may correspond to or may include a source electrode of the first semiconductor chip 17. In particular, the gate electrode 25 and the source electrode 26 may be electrically insulated from each other.

A first optional diode 27 may be arranged over (or on) the second section 12B of the first electrically conductive material 12. In particular, the first diode 27 may be a flyback diode that may be electrically connected in parallel to the first semiconductor chip 17. The first diode 27 may include a first electrical contact (not illustrated) that may be arranged over (or on) a first main surface of the first diode 27 facing the second section 12B and a second electrical contact (not illustrated) that may be arranged over (or on) a second main surface of the first diode 27 facing away from the second section 12B. The first electrical contact of the first diode 27 may be electrically connected to the second section 12B of the first electrically conductive material 12.

In FIG. 5E, a first electrically conductive element 28 may be provided. In the example of FIG. 5E, the first electrically conductive element 28 may correspond to or may include a clip 28. The clip 28 may be electrically coupled to the source electrode 26 and the first electrical contact of the first diode 27. For example, corresponding electrical connections may be provided by using at least one of a sintering process, a diffusion soldering process, a bonding process, etc. Hence, it may be possible to electrically contact the source electrode 26 via the clip 28. Furthermore, a second electrically conductive element 29 may be provided. In the example of FIG. 5E, the second electrically conductive element 29 may correspond to or may include a wire 29. The wire 29 may provide an electrical connection between the gate electrode 25 and the first section 12A of the first electrically conductive material 12.

In FIG. 5F, a second semiconductor chip 18 may be arranged over (or on) the first section 14A and the second section 14B of the second electrically conductive material 14.

In the example of FIG. 5F, the second semiconductor chip 18 may correspond to or may include a power semiconductor chip, for example an IGBT chip. In particular, the second semiconductor chip 18 may be similar to the first semiconductor chip 17. The second semiconductor chip 18 may include a first main surface 30 facing the second electrically conductive material 14 and an opposite second main surface 31 facing away from the second electrically conductive material 14. A first electrical contact 32 may be arranged over (or on) the second main surface 31. In particular, the first electrical contact 32 may include a drain electrode of the second semiconductor chip 18.

A second electrical contact 33 and a third electrical contact 34 may be arranged over (or on) the first main surface 30 of the second semiconductor chip 18. The second electrical contact 33 may correspond to or may include a gate electrode of the second semiconductor chip 18, and the third electrical contact 34 may correspond to or may include a source electrode of the second semiconductor chip 18. In particular, the gate electrode 33 and the source electrode 34 may be electrically insulated from each other. The gate electrode 33 may be electrically coupled to the first section 14A of the second electrically conductive material 14, while the source electrode 34 may be electrically coupled to the second section 14B of the second electrically conductive material 14. Hence, the source electrode 34 of the second semiconductor chip 18 may be electrically connected to the drain electrode 24 of the first semiconductor chip 17 via the second section 14B of the second electrically conductive material 14, the electrically conductive connection 16 and the second section 12B of the first electrically conductive material 12. The electrical connections between the electrodes 33, 34 and the second electrically conductive material 14 may be similar to previously described electrical connections.

A second optional diode 35 may be arranged over (or on) the second section 14B of the second electrically conductive material 14. In particular, the second diode 35 may be a flyback diode that may be electrically connected in parallel to the second semiconductor chip 18. The second diode 35 may include a first electrical contact (not illustrated) that may be arranged over (or on) on a first main surface of the first diode 35 facing the second electrically conductive material 14 and a second electrical contact (not illustrated) that may be arranged over (or on) a second main surface of the second diode 35 opposite to the first main surface. The first electrical contact of the second diode 35 may be electrically connected to the second section 14B of the second electrically conductive material 14.

In FIG. 5G, a third electrically conductive element 36 may be provided. In the example of FIG. 5G, the third electrically conductive element 36 may correspond to or may include a clip 36. The clip 36 may be electrically coupled to the drain electrode 32 of the second semiconductor chip 18 and the second electrical contact of the second diode 35. For example, associated electrical connections may be provided by using at least one of a sintering process, a diffusion soldering process, a bonding process, etc. Hence, it may be possible to electrically contact the drain electrode 32 of the second semiconductor chip 18 via the clip 36.

The described method may include further acts which are not explicitly illustrated herein. In an optional act, further electronic components may be arranged over the first main surface 13 and/or the second main surface 15. In a further optional act, one or components of the device 500 may be encapsulated by an encapsulation material (not illustrated). In this case, various electrical contact elements may be provided such that electrical contacts or electrodes of the components may be contacted from outside of the encapsulation material. The clips 28 and 36 may at least partly remain uncovered by the encapsulation material such that the source electrode 26 of the first semiconductor chip 17 and the drain electrode 32 of the second semiconductor chip 18 may be electrically contacted from outside of the encapsulation material. The device 500 may include an electrical contact element (not illustrated) at least partly uncovered by the encapsulation material and providing an electrical coupling to the gate electrode of the first semiconductor chip 17 from outside of the encapsulation material. Moreover, the device 500 may include a further electrical contact element (not illustrated) at least partly uncovered by the encapsulation material and providing an electrical coupling to the gate electrode 33 of the second semiconductor chip 18 from outside of the encapsulation material. In addition, the device 500 may include a further electrical contact element (not illustrated) at least partly uncovered by the encapsulation material and providing an electrical coupling to the drain electrode 24 of the first semiconductor chip 17 and the source electrode 34 of the second semiconductor chip 18 from outside of the encapsulation material. In one example, at least one of the clips 28, 36 and the described electrical contact elements may be formed such that the device 500 may be mounted on and electrically connected to a PCB via at least one of the clips 28, 36 and the electrical contact elements.

In the example of FIG. 5G, the semiconductor chips 17, 18 and the diodes 27, 35 are arranged on different main surfaces 13, 15 of the substrate 10. A footprint of the first semiconductor chip 17 may overlap with a footprint of the second semiconductor chip 18 when viewed in a direction perpendicular to the substrate 10. It may be possible to manufacture a device having electronic properties similar to the device 500, but wherein the semiconductor chips 17, 18 and the diodes 27, 35 may be arranged on only one main surface of the substrate 10. Compared to this alternative device, due to the possible overlap of the footprints of the semiconductor chips 17 and 18, the main surfaces 13, 15 of the device 500 may have a reduced surface area. Compared to the alternative device, the surface area of the main surfaces 13, 15 may be reduced by a factor of e.g. about two. Compared to arranging the semiconductor chips 17, 18 and the diodes 27, 35 on only one main surface of the substrate 10, arranging the semiconductor chips 17, 18 and the diodes 27, 35 on both sides of the substrate 10 may increase the integration density of the device 500. Even when electronic components may be arranged on both sides of the substrate 10, the electronic components may be arranged on the substrate 10 in such a way that it may still be possible to cool the device 500 from both sides.

The multichip device 500 may be configured to operate as a half bridge circuit. An exemplary schematic diagram of a half bridge circuit 900 is described in connection with FIG. 9. In particular, a half bridge circuit may include a high side switch and a low side switch. When using the multichip device 500 of FIG. 5G as a half bridge circuit, the first semiconductor chip 17 may include the low side switch, and the second semiconductor chip 18 may include the high side switch.

Devices in accordance with the disclosure are not restricted to merely operate as a half bridge circuit. Instead, other electronic circuits may be realized by employing devices in accordance with the disclosure. Here, similar to previously described devices, electronic components may again be arranged on both sides of the substrate. The further devices in accordance with the disclosure may include a combination of semiconductor chips, active electronic components, passive electronic components, etc. depending on the electronic circuit that is to be formed. For example, a further device in accordance with the disclosure may be configured to operate as any other bridge circuit, for example a full bridge circuit.

FIG. 6 schematically illustrates a cross-sectional view of a further device 600 in accordance with the disclosure. The device 600 may be similar to the device 500 such that description associated with FIGS. 5A to 5G may also hold true for FIG. 6. Similar to FIG. 5G, a first semiconductor chip 17 and a first diode 27 may be arranged over (or on) a first main surface 13 of the substrate 10 while a second semiconductor chip 18 and a second diode 35 may be arranged over (or on) a second main surface 15 of the substrate 10. In contrast to FIG. 5G, a footprint of the first semiconductor chip 17 may be arranged outside of a footprint of the second semiconductor chip 18 when viewed in a direction perpendicular to the substrate 10. In the example of FIG. 6, the footprints of the semiconductor chips 17 and 18 do not intersect. Furthermore, the clips 26 and 36 have been replaced by wires. The device 600 may include one or more electrical contact elements providing electrical contact to the electrodes of the semiconductor chips 17 and 18. Possible electrical contact elements have been previously described in connection with the device 500.

The device 600 may include a third section 12C of the first electrically conductive material 12 and a third section 14C of the second electrically conductive material 14. The sections 12C and 14C may particularly be configured to support a heat dissipation in a direction away from at least one of the first semiconductor chip 17 and the second semiconductor chip 18. For example, heat may occur at the first semiconductor chip 17 and the second semiconductor chip 18 during an operation of the device 600.

FIG. 7 schematically illustrates a cross-sectional view of a further device 700 in accordance with the disclosure. In particular, the device 700 may include components similar to the device 600. Compared to FIG. 6, the device 700 may include a third semiconductor chip 37 and a third diode 38 that may be electrically connected in parallel and may e.g. be arranged adjacent to the second semiconductor chip 18. In particular, the third semiconductor chip 37 and the third diode 38 may be similar to the first semiconductor chip 17 and the first diode 27 in FIG. 5G. That is, the third semiconductor chip 37 may e.g. include a low side switch of a half bridge circuit. In this regard, the third semiconductor chip 37 may be electrically coupled to a further semiconductor chip (not illustrated) that may include a high side switch such that the device 700 may include two half bridge circuits.

FIG. 8 schematically illustrates a cross-sectional view of a further device 800 in accordance with the disclosure. In particular, the device 800 may be similar to the device 700. Compared to the FIG. 7, the device 800 may include an encapsulation material 20 that may cover various components of the device 800. Some components of the device 800 may remain uncovered by the encapsulation material 20. In the example of FIG. 8, the third section 14C of the second electrically conductive material 14 may remain uncovered by the encapsulation material 20. The uncovered part may be configured to support a heat dissipation in a direction away from at least one of the first semiconductor chip 17, the second semiconductor chip 18 and the third semiconductor chip 37. The device 800 may include one or more electrical contact elements (not illustrated) that may provide an electrical contact to encapsulated components from outside of the encapsulation material 20. Possible electrical contact elements have been discussed in connection with the device 500.

FIG. 9 illustrates a schematic diagram of a half bridge circuit 900. A device in accordance with the disclosure may be configured to operate as such a half bridge circuit. The half bridge circuit 900 may be arranged between nodes N1 and N2. The half bridge circuit 900 may include switches S1 and S2 connected in series. The power semiconductor chips 17 and 18, as e.g. shown in FIG. 5G of the device 500, may be implemented as the switches S1 and S2. Constant electrical potentials may be applied to the nodes N1 and N2. For example, a high potential, such as 10, 50, 100, 200, 500 or 1000 V or any other potential, may be applied to the node N1 and a low electrical potential, for example 0 V, may be applied to the node N2. Thus, the first semiconductor chip 17 may be configured to act as the low side switch, whereas the second semiconductor chip 18 may be configured to act as the high side switch. The switches S1 and S2 may be switched at frequencies in the range from 1 kHz to 100 MHz, but the switching frequencies may also be outside this range. This means that a varying electrical potential may be applied to a node N3 arranged between the switches S1 and S2 during an operation of the half bridge. The potential of the node N3 may vary in the range between the low and the high electrical potential.

The half bridge circuit may, for example, be implemented in electronic circuits for converting DC voltages, so-called DC-DC converters. DC-DC converters may be used to convert a DC input voltage provided by a battery or a rechargeable battery into a DC output voltage matched to the demand of electronic circuits connected downstream. DC-DC converters may be embodied as step down converters, in which the output voltage is less than the input voltage, or as step up converters, in which the output voltage is greater than the input voltage. Frequencies of several MHz or higher may be applied to DC-DC converters. Furthermore, currents of up to 50 A or even higher may flow through the DC-DC converters.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding, and that actual dimensions may differ substantially from that illustrated herein.

Although specific examples have been illustrated and described herein, it will be appreciated by those of ordinary skill in the art that a variety of alternate and/or equivalent implementations may be substituted for the specific aspects shown and described without departing from the scope of the disclosure. This application is intended to cover any adaptations or variations of the specific aspects discussed herein. Therefore, it is intended that this disclosure be limited only by the claims and the equivalents thereof.

What is claimed is:
1. A device, comprising:
   a substrate comprising an electrically insulating core;
   a first electrically conductive material arranged over a first main surface of the substrate;
   a second electrically conductive material arranged over a second main surface of the substrate opposite to the first main surface;

an electrically conductive connection electrically coupling the first electrically conductive material and the second electrically conductive material;
a first semiconductor chip arranged over the first main surface and electrically coupled to the first electrically conductive material, the first semiconductor chip having a first electrical contact on a first main surface of the first semiconductor chip and a second electrical contact on an opposite second main surface of the first semiconductor chip, each of the first and second electrical contacts coupled to the first electrically conductive material, wherein a diode is electrically interconnected between the second electrical contact and the first electrically conductive material; and
a second semiconductor chip arranged over the second main surface and electrically coupled to the second electrically conductive material.

2. The device of claim 1, wherein at least one of the first semiconductor chip and the second semiconductor chip comprises a power semiconductor.

3. The device of claim 1, wherein the electrically insulating core comprises at least one of a ceramic material and a plastic material.

4. The device of claim 1, wherein the electrically insulating core comprises at least one of aluminum oxide, aluminum nitride, aluminum titanate, silicon nitride, zirconium oxide, silicon carbide, titanium oxide, and beryllium oxide, and wherein at least one of the first electrically conductive material and the second electrically conductive material comprises copper.

5. The device of claim 1, wherein the substrate comprises a Direct Copper Bond (DCB) substrate.

6. The device of claim 1, further comprising:
an encapsulation material at least partly encapsulating the substrate.

7. The device of claim 6, wherein at least a part of the first electrically conductive material and the second electrically conductive material remains exposed from the encapsulation material, wherein the exposed part is configured to support a heat dissipation in a direction away from at least one of the first semiconductor chip and the second semiconductor chip.

8. The device of claim 1, wherein the first semiconductor chip comprises a drain contact electrically coupled to the first electrically conductive material and the second semiconductor chip comprises a source contact electrically coupled to the second electrically conductive material.

9. The device of claim 1, wherein the first semiconductor chip comprises a first power transistor, the second semiconductor chip comprises a second power transistor and the device further comprises:
at least one of a first diode electrically connected in parallel to the first power transistor and a second diode electrically connected in parallel to the second power transistor.

10. The device of claim 1, further comprising:
a half bridge circuit comprising a low side switch and a high side switch, wherein the first semiconductor chip comprises the low side switch and the second semiconductor chip comprises the high side switch.

11. The device of claim 1, wherein a footprint of the first semiconductor chip overlaps with a footprint of the second semiconductor chip when viewed in a direction perpendicular to the substrate.

12. The device of claim 1, wherein a footprint of the first semiconductor chip is arranged outside of a footprint of the second semiconductor chip when viewed in a direction perpendicular to the substrate.

13. The device of claim 1, wherein the electrically insulating core has a thickness between 50 micrometer and 1.6 millimeter.

14. The device of claim 1, wherein the electrically conductive connection extends from the first main surface to the second main surface and through an opening of the electrically insulating core, wherein the opening has a width between 50 micrometer and 2.6 millimeter.

15. The device of claim 1, wherein each of the first electrically conductive material and the second electrically conductive material has a respective thickness between 0.1 millimeter and 0.5 millimeter.

16. The device of claim 1, further comprising:
at least one further semiconductor chip arranged over the first main surface adjacent to the first semiconductor chip or over the second main surface adjacent to the second semiconductor chip.

17. The device of claim 1, further comprising:
an electrically conductive element configured to provide an electrical coupling to the first semiconductor chip or the second semiconductor chip.

18. The device of claim 17, wherein the electrically conductive element comprises at least one of a bonding wire and a clip.

19. A device, comprising:
a substrate comprising an electrically insulating core, a first electrically conductive material arranged over a first main surface of the substrate, and a second electrically conductive material arranged over a second main surface of the substrate;
a first semiconductor chip arranged over the first main surface, the first semiconductor chip having a first electrical contact on a first main surface of the first semiconductor chip and a second electrical contact on an opposite second main surface of the first semiconductor chip, each of the first and second electrical contacts coupled to the first electrically conductive material, wherein a diode is electrically interconnected between the second electrical contact and the first electrically conductive material; and
a second semiconductor chip arranged over the second main surface.

20. The device according to claim 19, wherein the first electrically conductive material includes a first section and a second section that are not electrically coupled, the first electrical contact coupled to the first section and the second electrical contact coupled to the second section.

* * * * *